United States Patent
Baldwin et al.

(10) Patent No.: US 7,439,096 B2
(45) Date of Patent: Oct. 21, 2008

(54) SEMICONDUCTOR DEVICE ENCAPSULATION

(75) Inventors: Kirk W. Baldwin, Springfield, NJ (US);
Zhenan Bao, North Plainfield, NJ (US);
Peter Mach, Berkeley Heights, NJ (US);
John A. Rogers, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 484 days.

(21) Appl. No.: 09/789,397

(22) Filed: Feb. 21, 2001

(65) Prior Publication Data

US 2002/0155729 A1    Oct. 24, 2002

(51) Int. Cl.
*H01L 51/40* (2006.01)

(52) U.S. Cl. .......................... 438/99; 438/127

(58) Field of Classification Search ................. 438/112, 438/121–127, 758, 761, 770, 775, 778, 780, 438/787, 791, 99; 257/787, 788, 40
See application file for complete search history.

(56) References Cited

U.S. PATENT DOCUMENTS

| | | | | |
|---|---|---|---|---|
| 4,017,495 A | * | 4/1977 | Jaffe et al. | 264/272.17 |
| 4,960,656 A | * | 10/1990 | Chang et al. | 428/704 |
| 4,963,012 A | * | 10/1990 | Tracy et al. | 359/514 |
| 5,010,024 A | * | 4/1991 | Allen et al. | 438/659 |
| 5,162,892 A | * | 11/1992 | Hayashi et al. | 257/65 |
| 5,439,849 A | * | 8/1995 | McBride et al. | 438/763 |
| 5,854,141 A | * | 12/1998 | Cronin et al. | 438/763 |
| 5,923,964 A | | 7/1999 | Li | |
| 5,946,551 A | * | 8/1999 | Dimitrakopoulos et al. | 438/99 |
| 6,093,583 A | * | 7/2000 | Mukerji et al. | 438/113 |
| 6,103,541 A | * | 8/2000 | Yang et al. | 438/26 |
| 6,181,569 B1 | * | 1/2001 | Chakravorty | 361/761 |
| 6,340,789 B1 | * | 1/2002 | Petritsch et al. | 136/263 |
| 6,376,360 B1 | * | 4/2002 | Cha et al. | 438/624 |
| 6,403,397 B1 | * | 6/2002 | Katz | 438/99 |
| 6,429,450 B1 | * | 8/2002 | Mutsaers et al. | 257/40 |
| 6,528,816 B1 | * | 3/2003 | Jackson et al. | 257/40 |
| 6,544,908 B1 | * | 4/2003 | Weimer et al. | 438/798 |
| 6,621,098 B1 | * | 9/2003 | Jackson et al. | 257/40 |

FOREIGN PATENT DOCUMENTS

WO    WO 98/05072    *    2/1998

OTHER PUBLICATIONS

Klaux et al. "Pentacene Thin Film Transistor and Inverter Circuits", Jul. 1997, IEEE, pp. 20.7.1-20.7.4.*
Zhenan Bao, et al., "Soluble and Processable Regioregular Poly (3-hexylthiophene) for Thin Film Field-effect Transistor Applications with High mobility", *Applied Physics Letter*, vol. 69, p. 4108-4110, 1996.

* cited by examiner

*Primary Examiner*—Kevin M Picardat

(57) ABSTRACT

An encapsulated semiconductor device and method wherein an encapsulant material is deposited on the device in an environment that enhances device performance. Illustrative encapsulant materials are organic polymers, silicon polymers and metal/polymer-layered encapsulants. Encapsulant formation environments may include inert, reducing and ammonia gas environment. Further disclosed are an encapsulated transistor and a semiconductor device.

7 Claims, 1 Drawing Sheet

SEMICONDUCTOR DEVICE ENCAPSULATION

FIELD OF THE INVENTION

The invention relates to semiconductor device encapsulation.

BACKGROUND OF THE INVENTION

The properties of semiconductor devices, particularly thin film transistors (TFTs), may be degraded in certain environments. Thus, suitable encapsulate materials have been sought. Of particular interest is the encapsulation of organic semiconductor devices because of their compatibility with potentially cost-effective non-glass substrates. Conformal coatings have been applied to organic transistor devices to protect against device degradation. The coatings, however, may cause decreased device performance and failure. Possible mechanisms include chemical degradation, traps introduced by coatings and delamination of semiconductor films and/or drain and source electrodes. Furthermore, many encapsulants suitable in conventional applications tend to require a high deposition temperature that is near or above the melting temperature of the organic TFT elements. Thus, there is a need for an encapsulant that is capable of being formed at a low enough temperature and also is able to provide the necessary encapsulating properties.

Techniques for enhancing the semiconducting properties of organic semiconductor materials, such as annealing in particular environments, have been explored in the art. Two methods have been found useful in lowering a transistor's off-current while keeping field-effect mobility substantially unchanged. In the first method, the films are treated with ammonia by bubbling $N_2$ through ammonium hydroxide aqueous solution. The same method has been used to change the resistivities of conducting polymers. Thermal treatments, such as heating the samples under $N_2$ at 100° C. for five minutes, can also lower off-currents. However, upon removing the device from the annealing or ammonia environment, such enhancements seem to substantially disappear in a time-dependent fashion. Accordingly, there is a need to create and maintain such enhancements.

SUMMARY OF THE INVENTION

Embodiments of the invention include an encapsulated semiconductor device and method wherein an encapsulant material is deposited on the device in an environment that enhances device performance. Illustrative encapsulant materials are organic polymers, silicon polymers and metal/polymer-layered encapsulants. Illustrative encapsulant formation environments include inert, reducing and ammonia gas environment. Embodiments of the invention are particularly applicable to organic semiconductor device encapsulation.

Further disclosed are an encapsulated transistor and a semiconductor device.

DESCRIPTION OF THE DRAWINGS

The invention is best understood from the following detailed description when read with the accompanying drawings.

DETAILED DESCRIPTION OF THE INVENTION

Embodiments of the invention may enhance semiconductor device properties, and reduce degradation of these properties. A cap layer is deposited that encapsulates the semiconductor material, protecting it from external materials that may degrade the properties of the device.

TFT performance may be maximized by optimizing field effect mobility ($\mu_{FE}$) and on/off ratio. The former is related to the absolute quantity of "on" current ($I_{on}$) that can be induced in the device, and is defined for the regimes where current is linear with respect to source-drain voltage, and "saturated" (independent of source-drain voltage) in Equations 1 and 2, respectively, $$I_{on} = [WC_1 \mu_{FE} V_D (V_G - V_O)]/L \quad (1)$$

$$I_{on} = [WC_1 \mu_{FE} (V_G - V_O)^2]/2L \quad (2)$$

where W and L are channel width and length, respectively, $C_1$, is the capacitance per unit area of the gate dielectric, and $V_D$ $V_G$ and $V_O$ are the drain-source, gate-source, and threshold voltages, respectively. Equation 2 expresses this current relative to the current ($I_{off}$) that would flow in the absence of a gate field, as in Equation 3, $$I_{on}/I_{off} = \mu_{FE} C_1 V_G / 2 \mu_r \rho h \quad (3)$$

where $\mu_1$ and $\rho$ are the mobility and density of residual charge, respectively, and h is the height of the semiconducting layer.

The "off" state is defined as the case of little or no current flowing between the source and drain electrodes at a given source-drain voltage, while the "on" state refers to the case where substantial source-drain current flows at that voltage. Switching between the two states is accomplished by the application and removal of an electric field from the gate electrode across the gate dielectric to the semiconductor-dielectric interface, effectively charging a capacitor. When the TFT operates in the so-called accumulation mode, the charges on the semiconductor side of the capacitor injected from the source are mobile and conduct the source-drain "channel" current. For "p-type" semiconductors the carriers are holes, while electron-accepting materials are "n-type" and form channels of electrons. In the absence of a gate field, there is no channel and ideally no source-drain conduction. In practice, however, there can be adventitious off-currents caused by impurities in the semiconductor and by leakage pathways.

Figure 1A:
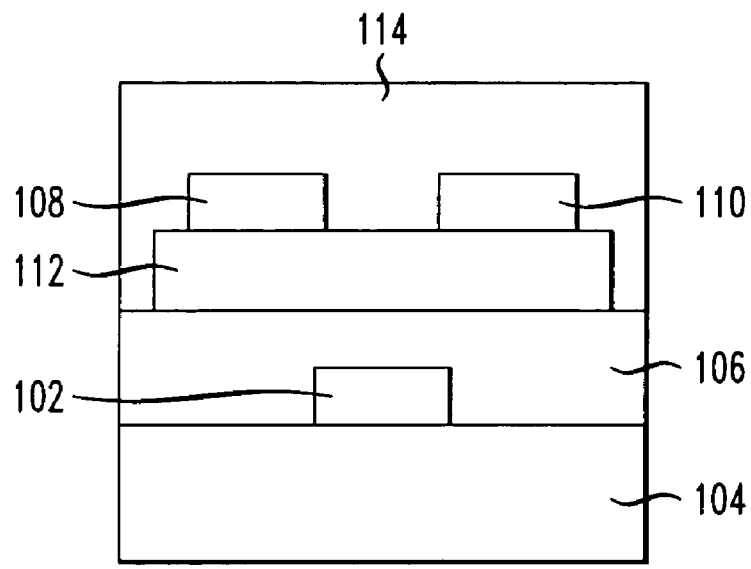
FIG. 1A depicts a schematic of a top contact TFT according to an illustrative embodiment of the invention.
Figure 1B:
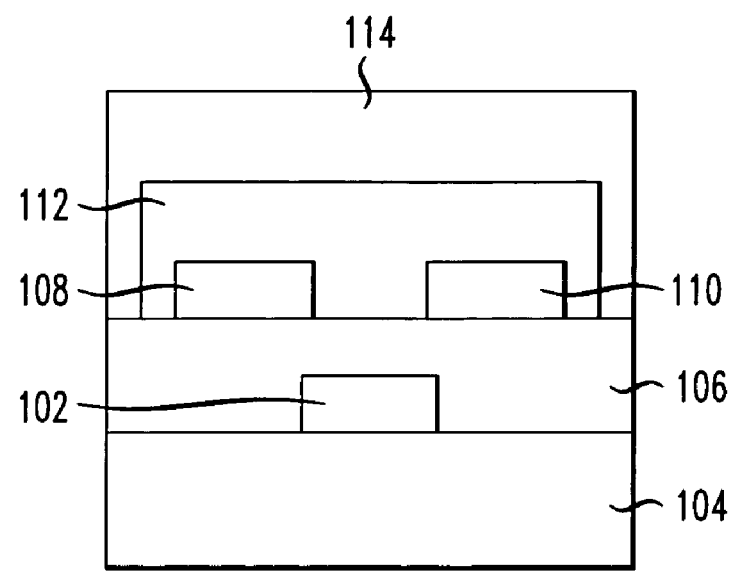
FIG. 1B depicts a schematic of a bottom contact TFT according to an illustrative embodiment of the invention.

Embodiments of the invention are particularly applicable to organic semiconductor device encapsulation, and therefore, for simplicity will be described primarily as they apply to such devices. Structures of illustrative embodiments of encapsulated TFTs are shown in FIGS. 1A and 1B. These may be for example, organic or polymeric TFTs. Those skilled in the art will understand that embodiments of the invention may apply to devices having other types of active or semiconductor layers, for example, inorganic or hybrid organic-inorganic layers. Some illustrative examples of active layer materials include, cadmium sulfide, pentacene, FCuPc and region regular poly(3-hexylthiophene) (PHT). It is preferable, but not necessary, to deposit the semiconductor at a substrate temperature of less than about 300° C. and more preferably, at less than about 130° C.

In an exemplary fabrication scheme, a gate metal 102 is first defined on a substrate 104. Illustrative examples of substrates include glass, silicon and plastic. Plastics may be, for example, polyester or polyimide. Examples of gate materials include gold, silver, conductive polymers and conductive oxides such as indium tin oxides. Illustrative conductive polymers include polyaniline and polythiophene.

Following gate metal definition, a gate dielectric 106 is deposited, substantially coating gate 102 and substrate 104. In an illustrative example, $SiO_2$ is provided as a dielectric. Illustrative categories of gate dielectrics include inorganic, polymer and inorganic/organic composites. Inorganic dielectrics may include for example, $SiN_x$, $Al_2O_3$ and $SiO_x$. Polymer dielectrics may include, for example, polyimide and glass resin. An exemplary inorganic/organic composite is titanium oxide nanoparticles blended with polyimide. The dielectric layer may be deposited for example, by low-pressure or plasma-enhanced chemical vapor deposition, evaporation, spin casting or sputtering. Gate dielectrics are typically deposited to a thickness of about 100-1000 nm. In an exemplary embodiment of the invention, $SiO_2$ is deposited to a thickness of about 3000 Å. Source and drain electrodes 108 and 110, respectively, can be fashioned directly on gate dielectric 106 as in FIG. 1B, in an arrangement known as "bottom contacts", or alternatively, on top of an active layer 112, referred to as "top contact" geometry, as shown in FIG. 1A. As FIG. 1B depicts, when gate electrodes 108 and 110 are located on dielectric 106, active layer 112 covers gate electrodes 108 and 110. An encapsulant 114 provides a protective cap layer for the device.

Exemplary requirements for an illustrative TFT are as follows:

| | |
|---|---|
| $I_{ON}$ | 1-2 µA |
| $I_{OFF}$ | <10 pA (ideally) |
| Response Time | <1 µs |

The values provided for these requirements correspond to non-emissive display requirements. These figures will be slightly different if the video rate requirement is relaxed. The on current requirement can be lower if the on/off ratio is maintained. The response times can also be larger in these cases.

In an exemplary embodiment the desired response time necessitates that three significant times be less than 1 µs: the transit time of carriers between the source and drain, the RC time constant of the device, and the channel conductivity response time. The first of these is easily met: if the mobility is >0.1 $cm^2$/V-s, the transit time across a 3-5µm, channel is <1 µs. The $R_{ON}C_i$ time constant of the transistor is also not likely to be a problem in properly designed devices. However, the channel conductivity response time can be long because of the kinetics associated with charging and discharging deep traps.

According to embodiments of the invention, a semiconductor device, such as a transistor device, is treated to enhance its performance parameters such as field effect mobility and on/off ratio. The device is encapsulated while remaining in the performance enhancing environment. By doing so, the improved performance of the device may be retained while the encapsulating layer protects against degradation that could occur for example, in an operating environment. Illustrative environments include, inert, ammonia, reducing, hydrogen and helium. A further illustrative environment is one that scavenges materials that would adversely affect device performance.

The encapsulation material is deposited on the device, preferably in a plasma enhanced chemical vapor deposition (PECVD) chamber, such as a Plasma-Therm™790. Further illustrative deposition techniques include vacuum evaporation and spin-on coating. Other deposition methods may be used provided that they are compatible with the encapsulation material and semiconductor device.

Any encapsulation material may be used that provides protection to the device, particularly from environmental factors, and does not cause damage or deformation to the device. The stoichiometry of the encapsulant material may be adjusted to optimize the encapsulant's properties. The encapsulant may be a single layer or may comprise multiple layers. Illustrative encapsulant materials include, but are not limited to, inorganic dielectrics, organic-inorganic hybrids, organic polymers, silicon polymers and multilayered materials such as metal/polymer or multilayers of any encapsulant materials such as those mentioned above. A multilayered encapsulant, such as metal/polymer encapsulant, may have any number of layers. Illustrative examples of inorganic dielectrics are $SiN_x$, and $SiO_x$. In an exemplary embodiment of the invention, the encapsulant is a mixture of $SiN_x$ compounds or $SiO_x$ compounds. It is possible for an encapsulant to comprise substantially one $SiN_x$ or $SiO_x$ compound. An illustrative range for "ax" for either $SiN_x$ or $SiO_x$ is about 0.1 to about 10.

The chamber pressure and radio frequency (RF) used for deposition are dependent, at least in part, on the encapsulant material and gas flow content.

In the following experimental examples, encapsulation materials were deposited on a silicon substrate in a PECVD chamber at a temperature of 130° C. $SiN_x$ was deposited at a chamber pressure of 900 millitorr with 25 watts RF using gas flows of 200 sccm 2% silane in a nitrogen balance, 2.3 sccm ammonia, and 900 sccm nitrogen. The deposition rate for $SiN_x$ at this temperature was approximately 11 nm/min. In a further experiment, $SiO_2$ was used as an encapsulant. The deposition conditions for the $SiO_2$ films were the same except the gas parameters are, 430 sccm 2% silane in a nitrogen balance, and 800 sccm nitrous oxide. The deposition rate for the $SiO_2$ films was approximately 60 nm/min.

Carrier mobility and on/off ratios were measured for the encapsulated devices. Measurements were also taken of non-encapsulated devices treated with the gas flows described above. The devices were purged with the gas. The gas was then removed from the chamber allowing the devices to be exposed to air. Measurements were made to determine the effect of the treatment. Comparing the pre-encapsulation measurements with those taken of the encapsulated devices may reflect the benefit of reducing or substantially eliminating device exposure to air before encapsulation. The measurements further reflect the benefit of the gas flow environment on device performance.

EXAMPLE 1

A pentacene semiconducting film was thermally evaporated onto a silicon substrate. Table 1 shows mobilities and on/off ratios for the devices before and after treatments with ammonium gas flows. Pentacene is a p-channel semiconductor. It tends to be doped in air by oxygen which decreases the on/off ratio. It is clearly seen from the results in Table 1 that the on/off ratios improve slightly after treatment with gas and the mobilities decrease slightly. In many applications the on/off ratio is more important that the mobility. More significantly, the encapsulated device showed much better on/off ratio. These results indicate that the annealing conditions (no plasma) help to improve the device performance due to heating in vacuum and treatment with ammonium gas. These results show that if the devices are encapsulated under those conditions, they substantially retain their good performance while the encapsulant reduces or prevents their exposure to air.

TABLE 1

| Performance Parameter | Before Treatment | SiN$_x$ Condition No Plasma | SiN$_x$ |
|---|---|---|---|
| Carrier Mobility | 0.15 cm$^2$/Vs | 0.12 cm$^2$/Vs | 0.08 cm$^2$/Vs |
| On/Off Ratio | 54.3 | 430 | 14000 |

EXAMPLE 2

A regioregular poly(3-hexylthiophene) (PHT) semiconducting film was prepared by casting a chloroform solution of PHT onto a silicon substrate and drying it in air. The device was then pumped under vacuum (~1 mTor) for two hours. Table 2 shows mobilities and on/off ratios for the devices before and after treatments. PHT is a p-channel semiconductor. It tends to be doped in air by oxygen which decreases the on/off ratio. It is clearly seen from the results in Table 2 that both the on/off ratios and mobilities improved after the treatment. More significantly, the encapsulated device showed much better on/off ratio and mobility. These results indicate that the annealing conditions (no plasma) help to improve the device performance due to heating in vacuum and treatment with ammonium gas. If the devices are encapsulated under those conditions, they substantially retain their good performance while the encapsulant reduces their exposure to air.

TABLE 2

| Performance Parameter | Before Treatment | SiN$_x$ Condition No Plasma | SiN$_x$ |
|---|---|---|---|
| Carrier Mobility | 8.34E-03 cm$^2$/Vs | 1.02E-02 cm$^2$/Vs | 2.35E-02 cm$^2$/Vs |
| On/Off Ratio | 6.1 | 10.4 | 112 |

EXAMPLE 3

A FCuPc semiconducting film was vacuum evaporated onto a silicon substrate. Table 3 provides mobilities and on/off ratios for the devices before and after treatments. FCuPc is an n-channel semiconductor. Oxygen can act as traps and lower its mobility. In a reducing environment such as the conditions for depositing SiN$_x$, oxygen and other oxidative traps can be removed and improve device characteristics, as shown in Table 3. The nitrogen and NH$_3$ gases do not have high enough reducing strength to cause doping of the semiconductor. However, the plasma had enough power to cause doping of the n-channel material. As a result, the off-currents increased by approximately 400 times, and the on/off ratios decreased by approximately 100 times. Under the SiO$_x$ condition, both with and without plasma, the device performance improved, probably because the oxidative gas in this case is not oxidative enough to induce traps in the material and the "heating in vacuum" process may have helped remove some absorbed oxygen in the semiconducting thin film.

TABLE 3

| Performance Parameter | Before Treatment | SiN$_x$ Condition No Plasma | SiN$_x$ | SiO$_x$ Condition No Plasma | SiO$_x$ |
|---|---|---|---|---|---|
| Carrier Mobility | 5.86E-03 cm$^2$/Vs | 9.16E-03 cm$^2$/Vs | 2.28E-03 cm$^2$/Vs | 7.53E-03 cm$^2$/Vs | 7.39E-03 cm$^2$/Vs |
| On/Off Ratio | 50.8 | 113 | 1.6 | 68.6 | 137.5 |

The experimental materials and conditions used in the above experiments provide an illustrative example of materials and conditions for embodiments of the invention. Depending on factors such as the encapsulant stoichiometry and device type, it may be preferable to vary the conditions. Exemplary deposition temperature ranges are about 40° C. to about 300° C., about 50° C. to about 150° C., and about 75° C. to about 145° C. Temperatures of less than about 150° C. are particularly advantageous because they allow use of plastic device components such as substrates. Deposition pressure may be for example, in the range of about 300 mT to about 2000 mT, and about 750 mT to about 1000 mT. An illustrative deposition power range is about 10 watts to about 60 watts. Deposition rates may vary depending on, for example, deposition conditions, methods and materials. An illustrative deposition rate range is about 1 nm/min to about 100 nm/min. The ratio of gas flow components to one another may also be varied from the experimental conditions. The desired environment component ratio chosen may depend on the environment that will best enhance the device performance. Furthermore, the makeup of each gas flow component may be varied. For example, the percent silane in the nitrogen balance may be varied from 2%.

While the invention has been described by illustrative embodiments, additional advantages and modifications will occur to those skilled in the art. Therefore, the invention in its broader aspects is not limited to specific details shown and described herein. Modifications, for example, to the type of encapsulant material, method of encapsulant formation and encapsulation environment, may be made without departing from the spirit and scope of the invention. Accordingly, it is intended that the invention not be limited to the specific illustrative embodiments but be interpreted within the full spirit and scope of the appended claims and their equivalents.

The invention claimed is:

1. A method of encapsulating an organic semiconductor device, said method comprising the steps of:
   providing said organic semiconductor device, said device comprising a source electrode, a drain electrode, a gate electrode and a semiconductor layer comprising pentacene or FCuPc, the device being capable of switching between at least two current flow states;
   treating said organic semiconductor device with ammonium gas; and
   subsequent to said treating with ammonium gas and while said device remains in an environment substantially free of gaseous oxygen, depositing an encapsulating layer over said device.

2. The method of claim 1 wherein said encapsulating layer consists essentially of silicon nitride.

3. The method of claim 1 wherein said step of depositing is performed in a plasma enhanced chemical vapor deposition chamber.

4. The method of claim 1, wherein, the device is subjected to ammonium gas during the depositing.

5. The method of claim 1 wherein said encapsulating layer consists essentially of silicon oxide.

6. The method of claim 1 wherein the semiconductor layer comprises FCuPc.

7. The method of claim 1 wherein the semiconductor layer comprises pentacene.

* * * * *